United States Patent

Graener et al.

[11] Patent Number: 5,375,517
[45] Date of Patent: Dec. 27, 1994

[54] METHOD AND APPARATUS FOR SCREEN PRINTING

[75] Inventors: Rudolf Graener, Erkrath; Norbert Von Der Lippe, Moers; Peter Sommer, Duisburg, all of Germany

[73] Assignee: Rheinmetall GmbH, Ratingen, Germany

[21] Appl. No.: 15,907

[22] Filed: Feb. 10, 1993

[30] Foreign Application Priority Data

Feb. 14, 1992 [DE] Germany .................... 4204392

[51] Int. Cl.⁵ .............................................. B41M 1/12
[52] U.S. Cl. ................................... 101/129; 101/126
[58] Field of Search ............... 101/114, 123, 124, 126, 101/129, 489

[56] References Cited

U.S. PATENT DOCUMENTS

| | | | |
|---|---|---|---|
| 3,592,132 | 7/1971 | Weber | 101/119 |
| 3,986,450 | 10/1976 | Zimmer | 101/115 |
| 4,091,726 | 5/1978 | Walker | 101/126 |
| 4,524,688 | 6/1985 | Glantsching | 101/124 |
| 4,649,816 | 3/1987 | Gasper et al. | 101/126 |
| 5,044,306 | 9/1991 | Erdmann | 101/123 |
| 5,073,840 | 12/1991 | Coors | 101/129 |

FOREIGN PATENT DOCUMENTS

| | | |
|---|---|---|
| 3823853 | 1/1990 | Germany . |
| 86/04287 | 7/1986 | WIPO . |
| 86/04850 | 8/1986 | WIPO . |

*Primary Examiner*—Ren Yan
*Attorney, Agent, or Firm*—Spencer, Frank & Schneider

[57] ABSTRACT

An apparatus for screen printing on a thin, curved steel hybrid board includes a receiving frame having a nest for seating the board therein; and a magnet accommodated in the receiving frame for maintaining the board in a flattened state during the screen printing operation.

6 Claims, 1 Drawing Sheet

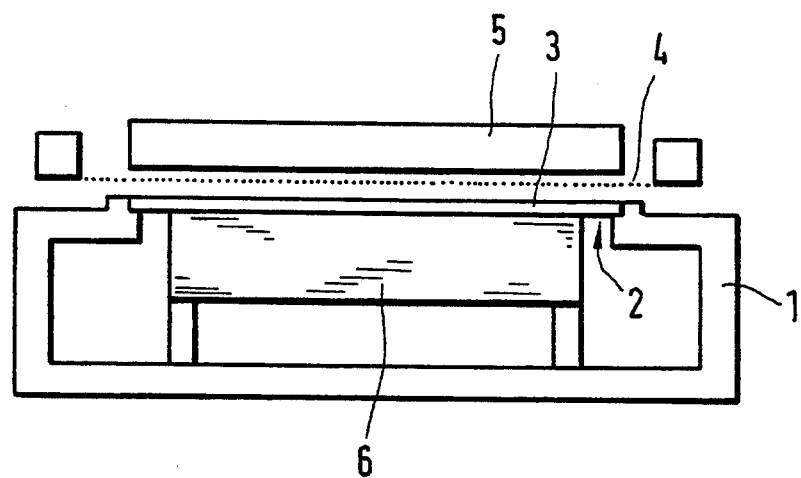

METHOD AND APPARATUS FOR SCREEN PRINTING

CROSS REFERENCE TO RELATED APPLICATION

This application claims the priority of German Application No. P 42 04 392.1 filed Feb. 14, 1992, which is incorporated herein by reference.

BACKGROUND OF THE INVENTION

This invention relates to a method and an apparatus for screen printing on thin, curved steel hybrid plates, particularly circuit boards (cards) which are seated in a screen printing nest.

The manufacture of circuit boards from steel hybrid plates, that is, from a plate-like steel substrate which has a thickness of between approximately 0.5 to 6 mm and which is coated with an electrically insulating inorganic material, such as glass, ceramic, enamel or glass-ceramic is known by itself.

It is a frequent occurrence during the firing of the insulating layer or layers that the thin circuit boards undergo a bending deformation. Although this can be counteracted by using a thicker board, such a solution, however, is generally not desirable because of the increased cost and weight of the circuit boards. Further, a thicker metal sheet may cause problems during the firing process.

Further, although it is feasible to print on a curved plate with a curved die, such a printing method is often not sufficiently accurate because a die printing allows layer thicknesses only up to 10 $\mu$m whereas significantly greater thicknesses can be achieved with screen printing. Thus, on printed circuit boards often conductor strips having a width in the order of magnitude of 50 $\mu$m are printed so that in case of curved plates accuracy problems concerning the contour and the conductor thickness are encountered because the printing screen and the foils for making the printing screen are planar.

SUMMARY OF THE INVENTION

It is an object of the invention to provide an improved method and apparatus of the above-outlined type with which a very high printing accuracy may be achieved even in case of curved plates.

This object and others to become apparent as the specification progresses, are accomplished by the invention, according to which, briefly stated, the apparatus for screen printing on a thin, curved steel hybrid board includes a receiving frame having a nest for seating the board therein; and a magnet accommodated in the receiving frame for maintaining the board in a flattened state during the screen printing operation.

BRIEF DESCRIPTION OF THE DRAWING

The sole FIGURE is a schematic sectional side elevational view of a preferred embodiment of the invention.

DESCRIPTION OF THE PREFERRED EMBODIMENT

Turning to the FIGURE, the screen printing apparatus shown therein includes a receiving frame 1 defining a printing nest 2 for seating a circuit board 3 constituted by a thin steel hybrid plate. Above the receiving frame 1 a screen 4 and a printing squeegee 5 are arranged to print metal alloy (for example, silver alloy) conductor strips on the board 3. In the receiving frame 1, under the screen printing nest 2 a magnet 6, such as an electromagnet is arranged which generates a magnetic force that is sufficient for holding a flattened circuit board 3.

The circuit board 3 is seated in the screen printing nest 2 for printing. The immobilization of the printing board 3 in the plane of the screen printing nest 2 is effected by positioning the circuit board in corners or in specially provided recesses. After positioning the circuit board 3, the electromagnet 6 is activated.

In case the circuit board 3 assumes a curved configuration upon firing of the ceramic or similar insulating layers, it is pressed flat. The electromagnet 6 holds the circuit board 3 in a planar condition during printing by pulling the circuit board 3 against the screen printing nest in a full face-to-face engagement, without the presence of an air gap. In this manner a planar surface is being printed with the aid of the planar screen 4.

By means of the electromagnet 6, the curving of the circuit board 3 is compensated for in a simple manner so that a highly accurate printing is achieved which is adapted for printing of conductor strips having a width in the order of magnitude of 50 $\mu$m or less. The obtained layer thickness of the conductor strips is uniform.

For small circuit boards 3 it may be advantageous to substitute permanent magnets for the electromagnet 6. In order to facilitate a release of the circuit board 3 after printing, the permanent magnet may be provided with shiftable pole shoes.

It is a further advantage of the invention that thinner sheet metal for the circuit board may be used.

It will be understood that the above description of the present invention is susceptible to various modifications, changes and adaptations, and the same are intended to be comprehended within the meaning and range of equivalents of the appended claims.

What is claimed is:

1. A method of screen printing on a thin, curved steel hybrid board, comprising the following steps:
   (a) providing a nest in a screen printing machine for receiving the board;
   (b) seating the board in the nest;
   (c) applying a magnetic force to the board seated in the nest for pulling the board flat against the nest in a full, face-to-face engagement therewith; and
   (d) screen printing on the board while it is held flat by said magnetic force.

2. An apparatus for screen printing on a thin, curved steel hybrid board, comprising
   (a) a receiving frame including a nest for seating the board therein; and
   (b) means for maintaining the board in a flattened state against said nest; said means including magnet means accommodated in said receiving frame.

3. An apparatus as defined in claim 2, wherein said magnet means is situated underneath said nest.

4. An apparatus as defined in claim 3, wherein said magnet means comprises an electromagnet.

5. An apparatus as defined in claim 3, wherein said magnet means comprises a permanent magnet.

6. An apparatus for screen printing on a thin, curved steel hybrid board, comprising
   (a) a receiving frame including a nest for seating the board therein; and
   (b) means for maintaining the board in a flattened state by pulling the board against the nest in a full, face-to-face engagement therewith; said means including magnet means accommodated in said receiving frame.

* * * * *